(12) United States Patent
Corisis

(10) Patent No.: US 6,507,094 B2
(45) Date of Patent: Jan. 14, 2003

(54) DIE PADDLE CLAMPING FOR WIRE BOND ENHANCEMENT

(75) Inventor: David J. Corisis, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/903,318

(22) Filed: Jul. 11, 2001

(65) Prior Publication Data

US 2002/0030254 A1 Mar. 14, 2002

Related U.S. Application Data

(63) Continuation of application No. 09/635,022, filed on Aug. 4, 2000, now Pat. No. 6,288,441, which is a continuation of application No. 09/028,133, filed on Feb. 23, 1998, now Pat. No. 6,121,674.

(51) Int. Cl.$^7$ ............................................. H01L 23/495
(52) U.S. Cl. ........................ 257/666; 257/667; 257/786
(58) Field of Search ................................. 257/666, 676, 257/670, 669, 672, 673, 674, 781, 783, 784, 787, 780; 438/123; 361/813

(56) References Cited

U.S. PATENT DOCUMENTS

| | | | |
|---|---|---|---|
| 3,566,207 A | 2/1971 | Adams .................... 317/234 |
| 3,685,137 A | 8/1972 | Gardiner ................... 29/471.3 |
| 3,708,730 A | 1/1973 | Schierz et al. .......... 317/234 R |
| 4,030,657 A | 6/1977 | Scheffer ...................... 228/1 |
| 4,214,120 A | 7/1980 | Jones, Jr. et al. ............. 29/591 |
| 4,361,261 A | 11/1982 | Elles et al. ................. 228/103 |
| 4,434,347 A | 2/1984 | Kurtz et al. ............. 219/56.22 |
| 4,527,730 A | 7/1985 | Shirai et al. ................. 228/179 |
| 4,600,138 A | 7/1986 | Hill ............................ 228/179 |
| 4,603,803 A | 8/1986 | Chan et al. .................. 228/4.5 |
| 4,653,681 A | 3/1987 | Dreibelbis et al. ........... 228/4.5 |
| 4,765,531 A | 8/1988 | Ricketson et al. .......... 228/179 |
| 4,766,478 A | 8/1988 | Dennis ....................... 257/666 |
| 4,778,097 A | 10/1988 | Hauser ....................... 228/44.7 |
| 4,821,945 A | 4/1989 | Chase et al. ................. 228/179 |
| 4,978,393 A | 12/1990 | Maheas ....................... 208/22 |
| 4,978,835 A | 12/1990 | Luijtjes et al. ......... 219/121.64 |
| 5,035,034 A | 7/1991 | Cotney ...................... 29/25.01 |
| 5,062,565 A | 11/1991 | Wood et al. .................... 228/9 |
| 5,082,165 A | 1/1992 | Ishizuka ..................... 228/179 |
| 5,114,066 A | 5/1992 | Amador et al. .............. 228/4.5 |
| 5,148,959 A | 9/1992 | Cain et al. ................... 228/4.5 |
| 5,193,733 A | 3/1993 | You .............................. 228/4.5 |
| 5,197,652 A | 3/1993 | Yamazaki ................... 228/44.7 |
| 5,217,154 A | 6/1993 | Elwood et al. .............. 228/4.5 |
| 5,238,174 A | 8/1993 | Ricketson et al. ..... 228/180.21 |
| 5,264,002 A | 11/1993 | Egashira et al. ........... 29/25.01 |
| 5,307,929 A | 5/1994 | Seidler ....................... 206/331 |
| 5,307,978 A | 5/1994 | Ricketson et al. ........... 228/4.5 |
| 5,322,207 A | 6/1994 | Fogal et al. ............. 228/180.5 |
| 5,367,253 A | 11/1994 | Wood et al. ............. 324/158.1 |
| 5,372,972 A | 12/1994 | Hayashi et al. ............. 438/123 |
| 5,384,155 A | 1/1995 | Abbott et al. ............... 427/125 |
| 5,420,758 A | 5/1995 | Liang ......................... 361/813 |
| 5,421,503 A | 6/1995 | Perlberg et al. ............. 228/4.5 |
| 5,425,491 A | 6/1995 | Tanaka et al. ............. 228/44.7 |
| 5,445,306 A | 8/1995 | Huddleston ................. 228/1.1 |
| 5,465,899 A | 11/1995 | Quick et al. ............. 228/180.5 |
| 5,647,528 A | 7/1997 | Ball et al. ................ 228/180.5 |
| 6,121,674 A * | 9/2000 | Corisis ....................... 257/676 |
| 6,288,441 B1 * | 9/2001 | Corisis ....................... 257/676 |

OTHER PUBLICATIONS

H.K. Charles, Jr.; "Electrical Interconnection"; pps. 224–236.

* cited by examiner

*Primary Examiner*—Jasmine J B Clark
(74) *Attorney, Agent, or Firm*—TraskBritt

(57) ABSTRACT

A leadframe configuration for a semiconductor device has a die attach paddle with paddle support bars. In addition, clamp tabs extend outwardly from lesser supported locations of the paddle to underlie a conventional lead clamp. The clamp tabs are formed as an integral part of the paddle. Normal clamping during die attach and wire bonding operations prevents paddle movement and enhances integrity of the die bond and wire bonds.

69 Claims, 4 Drawing Sheets

DIE PADDLE CLAMPING FOR WIRE BOND ENHANCEMENT

CROSS-REFERENCE TO RELATED APPLICATIONS

This application is a continuation of application Ser. No. 09/635/022, filed Aug. 4, 2000, now U.S. Pat. No. 6,288,441, issued Sep. 11, 2001, which is a continuation of application Ser. No. 09/028,133, filed Feb. 23, 1998, now U.S. Pat. No. 6,121,674, issued Sep. 19, 2000.

BACKGROUND OF THE INVENTION

Field of the Invention: This invention relates generally to a semiconductor device assembly including a semiconductor die and leadframe. More particularly, the invention pertains to a leadframe with a mounting paddle to which a semiconductor die is bonded and with a plurality of leads of the leadframe connected to the bond pads on the die by wire bonding.

State of the Art: In the manufacture of semiconductor device assemblies, a single semiconductor die is most commonly incorporated into each sealed package. Many different package styles are used, including dual inline packages (DIP), zig-zag inline packages (ZIP), small outline J-bends (SOJ), thin small outline packages (TSOP), plastic leaded chip carriers (PLCC), small outline integrated circuits (SOIC), plastic quad flat packs (PQFP), and interdigitated leadframes (IDF). Some semiconductor device assemblies are connected to a substrate, such as a circuit board, prior to encapsulation.

The assembly of a semiconductor device and a leadframe and die ordinarily includes bonding of the die to a paddle of the leadframe, and wire bonding bond pads on the die to inner leads, i.e. lead fingers, of the leadframe. The inner leads, semiconductor die, and bond wires are then encapsulated, and extraneous parts of the leadframe excised.

In drawing FIG. 1, an exemplary PRIOR ART leadframe strip 10 is shown. The leadframe strip 10 comprises a thin metal foil. The leadframe strip 10 is configured for the mounting of a plurality of semiconductor dice, one on each die mount paddle 12. The leadframe strip 10 also includes parallel spaced side rails 14, 16 formed with a pattern of registry holes 18 for handling by automatic machinery. In addition, the leadframe strip 10 includes an arrangement of inner leads 20 configured for attachment to the bond pads of a semiconductor die during a wire bonding step. Outer leads 22 will become the external leads of the completed semiconductor device package for connection to, e.g., a circuit board. The leads 20, 22 are connected to the side rails 14, 16 by dam bars 24, and supported thereby. As shown, each of the die mount paddles 12 is connected to each of the side rails 14, 16 by a paddle support bar 26, 28, respectively, extending transversely with respect to the centerline 30 of the leadframe strip 10.

In an alternative arrangement, not shown, the paddle support bars 26, 28 extend parallel to centerline 30 from the die mount paddles 12 to dam bars 24 for support of the die mount paddles.

In forming a semiconductor device package, semiconductor dice are typically bonded to the paddles of the leadframe strip with an adhesive polymer, such as epoxy or a thermoplastic, with soft solder, or with a gold-silicon eutectic layer. Generally, each die mount paddle is slightly larger than the attached semiconductor die. The conductive bond pads of the semiconductor die are then wire bonded to the inner leads surrounding the semiconductor die, generally by the use of the well-known thermocompression bonding method, but sometimes by thermosonic or ultrasonic bonding methods.

During semiconductor die attach and wire bonding, the inner leads are typically clamped against a lower heater block or other flat member. The bonding tool itself is configured to compress the wire against the surface to which the wire is being bonded, i.e., a bond pad or inner lead. Examples of such are found in U.S. Pat. No. 4,600,138 of Hill, U.S. Pat. No. 4,030,657 of Scheffer, U.S. Pat. No. 4,603,803 of Chan et al., U.S. Pat. No. 4,778,097 of Hauser, U.S. Pat. No. 5,148,959 of Cain et al., U.S. Pat. No. 5,217,154 of Elwood et al., U.S. Pat. No. 5,421,503 of Perlberg et al., and U.S. Pat. No. 5,445,306 of Huddleston. It has generally been found, however, that auxiliary clamping apparatus may improve the quality of "second bonding", i.e., bonding of the wire to the inner leads.

Each inner lead being wire bonded may be clamped while being wire bonded only, or all leads may be simultaneously clamped.

Commercial wire bonding machines typically have an upper clamp member which includes a window for access to the semiconductor die, die paddle and inner end portions of the inner leads. The "frame" of the window acts as a narrow clamp which simultaneously holds down the inner leads surrounding the semiconductor die against the heater block. Alternatively, clamps are inserted through a window to hold the inner leads against the heater block. These "window" types of clamping arrangements are exemplified in U.S. Pat. No. 3,685,137 of Gardiner, U.S. Pat. No. 5,035,034 of Cotney, U.S. Pat. No. 5,322,207 of Fogal et al., U.S. Pat. No. 5,372,972 of Hayashi et al., U.S. Pat. Nos. 4,765,531, 5,238,174 and 5,307,978 of Ricketson et al., U.S. Pat. No. 5,082,165 of Ishizuka, and U.S. Pat. No. 5,264,002 of Egashira et al.

Various other types of prior art clamping apparatus and methods of clamping an inner lead or bond pad against a flat lower member are illustrated in U.S. Pat. No. 4,361,261 of Elles et al., U.S. Pat. No. 4,434,347 of Kurtz et al., U.S. Pat. No. 4,978,835 of Luijtjes et al., U.S. Pat. No. 5,193,733 of You, U.S. Pat. No. 5,197,652 of Yamazaki, U.S. Pat. No. 4,821,945 of Chase et al., and U.S. Pat. No. 5,647,528 of Ball et al.

U.S. Pat. No. 3,566,207 of Adams shows a leadframe in which the paddle support bars are clamped by "point" clamps.

A major source of package rejection is wire bond failure. Such failure has been attributed to overheating, underheating, chemical contamination, surface roughness, surface voids, oxide formation, presence of moisture, inadequate lead clamping, and other suspected causes.

While a wire bond "no-stick" may sometimes be detected and reworked on the spot, wire bond defects often do not become apparent until subsequent testing, or after the device has been encapsulated and/or has been in use. At this stage, the unit cost of the device itself is maximal. In addition, repair of a defective device may not be feasible.

On occasion, the die-to-paddle bond fails and may result in, e.g., shorting within the packaged device, wire bond breakage, loss of heat dissipation capability, and/or incomplete sealing of the package.

Even a relatively low frequency of defects in the wire bonds and in die-to-paddle bonds is extremely costly to the semiconductor industry.

It is therefore an object of the invention to provide a semiconductor device wherein the frequency of wire bond failures and die-to-paddle bond failures is reduced, the frequency of required wire bond rework is reduced, and the manufacturing cost is reduced.

BRIEF SUMMARY OF THE INVENTION

It has been generally assumed in the industry that the die mount paddle does not move during down-bonding of the semiconductor die, or during subsequent wire bonding. However, it has been discovered that significant movement sometimes may exist, and this movement contributes to poor semiconductor die-to-paddle bonding and can be a major cause of the observed failure, i.e., immediate "no-stick" or subsequent debonding of the wire bonds from the bond pads of the semiconductor die and/or from the metal inner leads.

In accordance with the invention, the pattern of paddle and leads on the leadframe is configured to provide a paddle with clampable tabs extending therefrom. The tabs extend outwardly from areas of the paddle which are otherwise largely unsupported or farthest from the paddle support bars. These tabs may be formed on the sides of the paddle along which there are few, if any, bond pads. Alternatively, the tabs may be on the same sides as the paddle support bars, particularly when the paddle support bars on the sides have few, if any, bond pads. Typically, the tabs are positioned on the long dimensions of the paddle. When the leadframe is clamped for die attach and wire bonding, a clamp member such as a circumscribing "window frame" simultaneously clamps the inner leads, paddle support bars and paddle tabs against a lower clamp member which may be a heater block. The paddle is thus more extensively supported and is much more resistant to flexing, bending, and lifting away from the lower clamp member during the bonding operations.

BRIEF DESCRIPTION OF THE SEVERAL VIEWS OF THE DRAWINGS

The invention is illustrated in the following figures, wherein the elements are not necessarily shown to scale.

DETAILED DESCRIPTION OF THE INVENTION

In the following discussion, the terms "upper" and "lower" are understood to include the inverse when referring to clamp members or leadframe levels of a bilevel leadframe.

Figure 1:
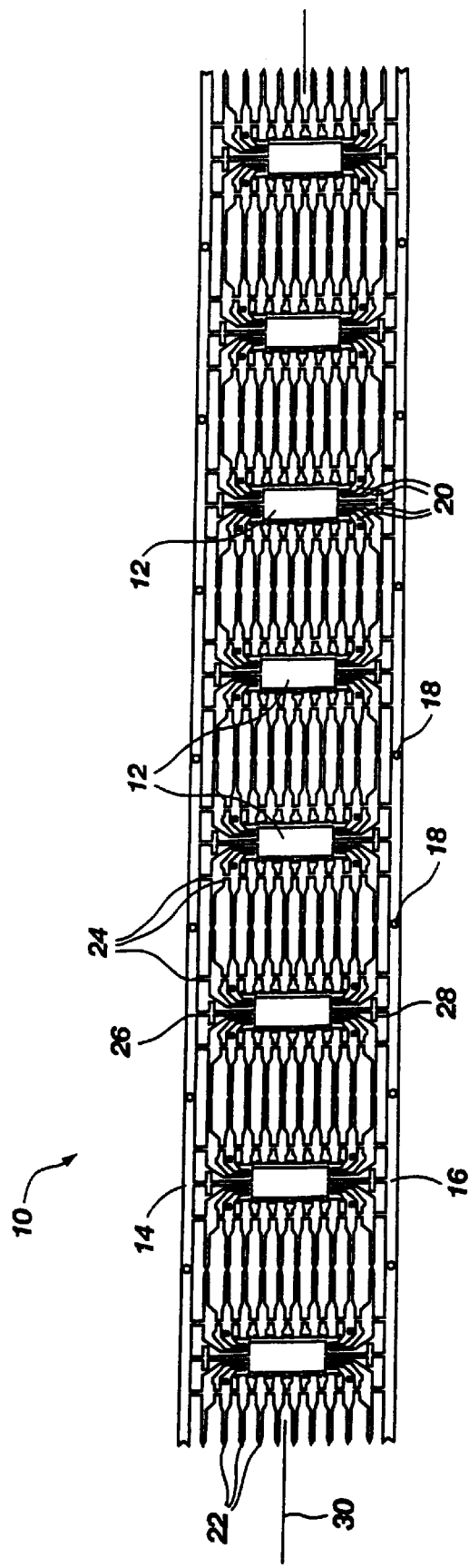
FIG. 1 is a plan view of a prior art semiconductor leadframe strip.
Figure 2:
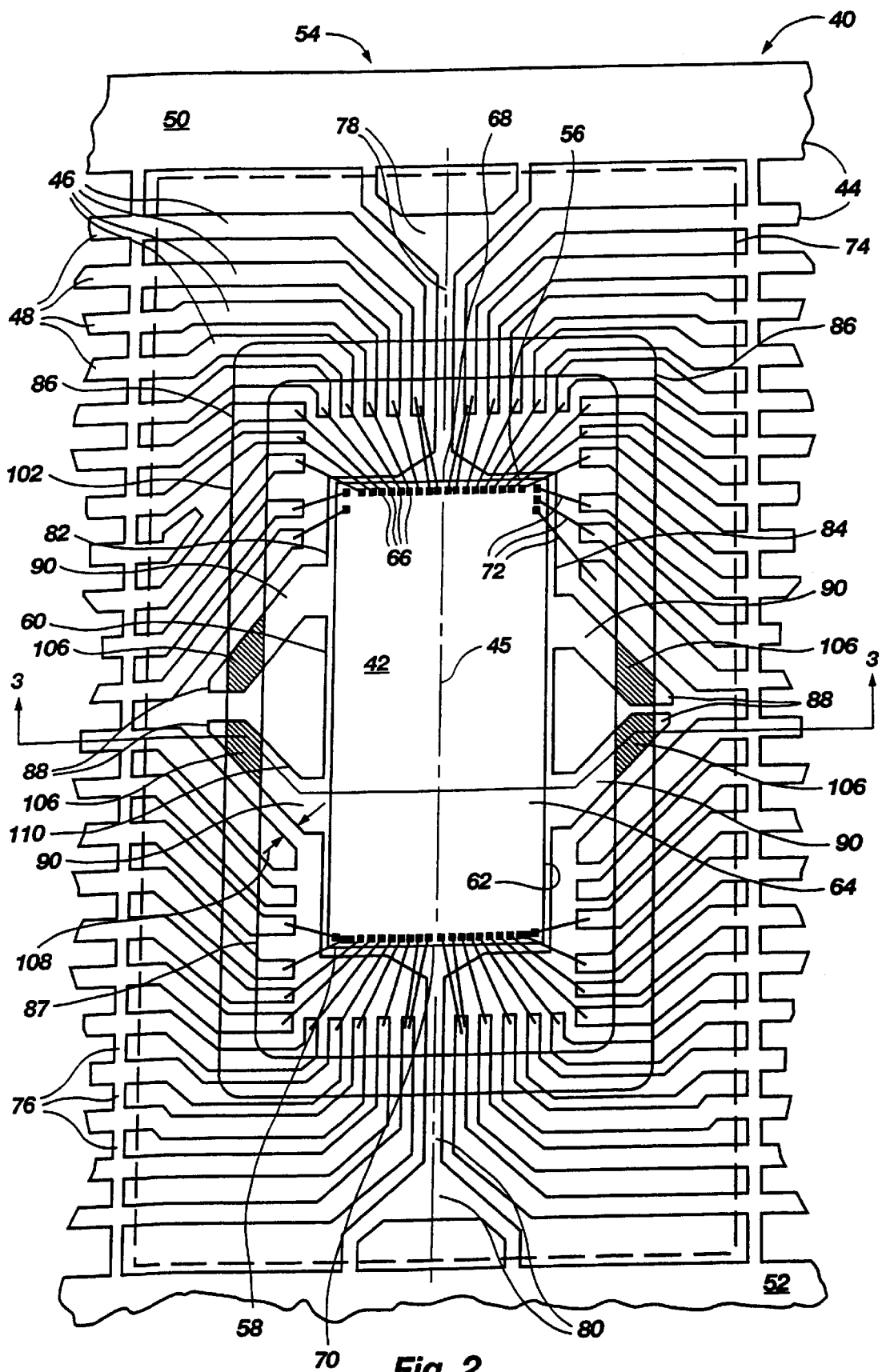
FIG. 2 is a plan view of a wire-bonded semiconductor device having a leadframe of the invention.
Figure 3:
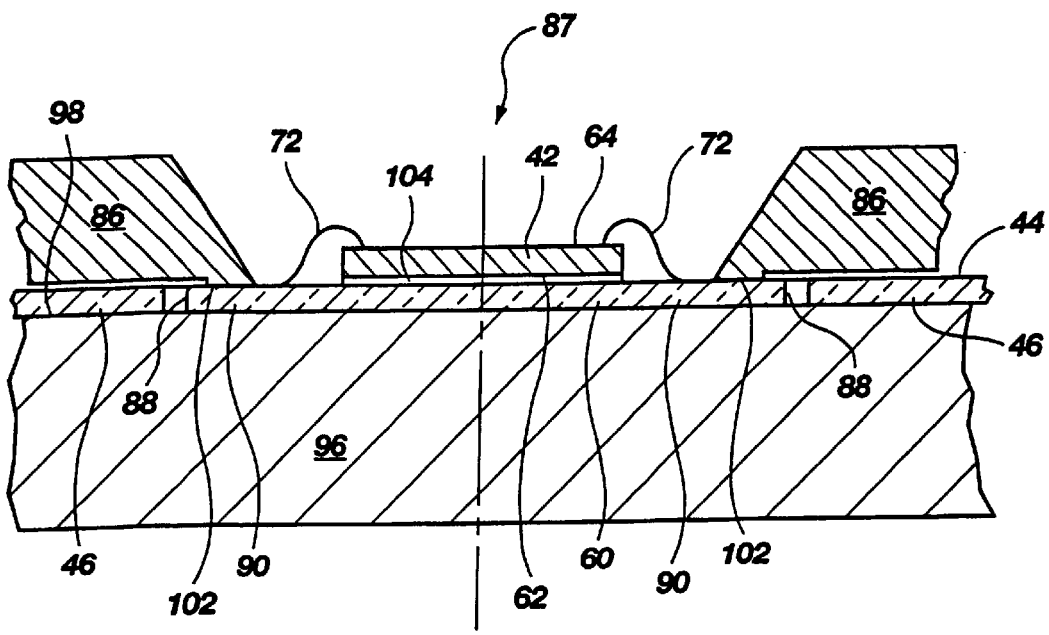
FIG. 3 is a cross-sectional side view of a portion of a leadframe strip of the invention and a semiconductor die bonded thereto, as taken along line 3—3 of FIG. 2.

As depicted in drawing FIGS. 2 and 3, a portion of an uncompleted exemplary semiconductor device 40 includes a semiconductor die 42 and a metal leadframe strip 44 to which the semiconductor die is attached. The final package outline 74 is shown with centerline 45. The leadframe strip 44 includes inner leads 46, outer leads 48, and spaced-apart side rails 50 and 52 for each of a plurality of leadframe panels 54. The inner leads 46 and outer leads 48 are supported from the side rails 50, 52 by dam bars 76. The outer leads 48 for the leadframe are only shown in part, but generally extend to a crossbar, not shown, or to the corresponding outer leads of the adjacent leadframe panels 54 of leadframe strip 44.

The leadframe strip 44 also includes a die mount paddle 60 which is configured for the mounting of the back side 62 of semiconductor die 42 thereon, using an adhesive layer 104 such as polyimide, epoxy, polymeric tape, etc. The adhesive layer 104 may be electrically nonconductive or conductive, depending upon the particular use for which the device is designed. The die mount paddle 60 is connected at each end 56, 58 to one of the leadframe rails 50, 52 by paddle support bars 78 and 80, and is supported thereby.

The semiconductor die 42 is illustrated as having an active surface 64 with a generally rectangular shape, although the semiconductor die may be of any shape. Bond pads 66 are arrayed adjacent the semiconductor die ends (edges) 68, 70 for conductive attachment to the inner leads 46 with thin bond wires 72. The wire bonding process may be one of thermocompression, ultrasonics or thermosonics, for example.

In accordance with the invention, the die mount paddle 60 is formed with clamping tabs 90 on each non-supported side 82, 84, i.e., the sides not having a paddle support bar. 78, 80. Each clamping tab 90 extends outwardly to underlie the upper clamp member 86 and may be clamped thereby to a lower clamp member, not shown, which underlies a major portion of the leadframe panel 54. The clamping tabs 90 are shown with outer ends 88 not connected to inner leads 46, side rails 50, 52, or other parts of the leadframe panel 54. Thus, the presence of the clamping tabs 90 does not affect the choice of conductive or nonconductive adhesive layer 104. The clamping tabs 90 are configured to be totally encapsulated in the completed packaged semiconductor device 40.

Drawing FIG. 2 shows two clamping tabs 90 on each side 82, 84 of the die mount paddle 60, the clamping tabs 90 extending outwardly and converging toward each other. The clamping surface 102 of the upper clamp member 86 intersects and exerts clamping force on the tab clamping areas 106 of the clamping tabs 90. The clamping tabs 90 may take any reasonable shape which will make the die mount paddle 60 more rigid but not result in shorting to leads or wires, and will not hinder polymer passage during encapsulation. Thus, the spacing 108,between the clamping tabs 90 and adjacent inner leads 46 and the space 110 between the two clamping tabs 90 permit adequate flow of polymer. The clamping tabs are shown as having a width comparable to the outer leads 48.

Preferably, the clamping tabs 90 are positioned so that there is no need for bond wires 72 to pass over the tabs.

As shown in the cross-sectional view of drawing FIG. 3, the inner leads 46 and die mount paddle 60 may be coplanar, and the upper clamp member 86 has a clamping surface 102 which surrounds wire-bonding access window 87 and compresses the inner leads 46, die mount paddle 60, and clamping tabs 90, as well as the paddle support bars 78, 80 (not visible) against the flat surface 98 of the lower clamp member 96, e.g., heater block.

Figure 4:
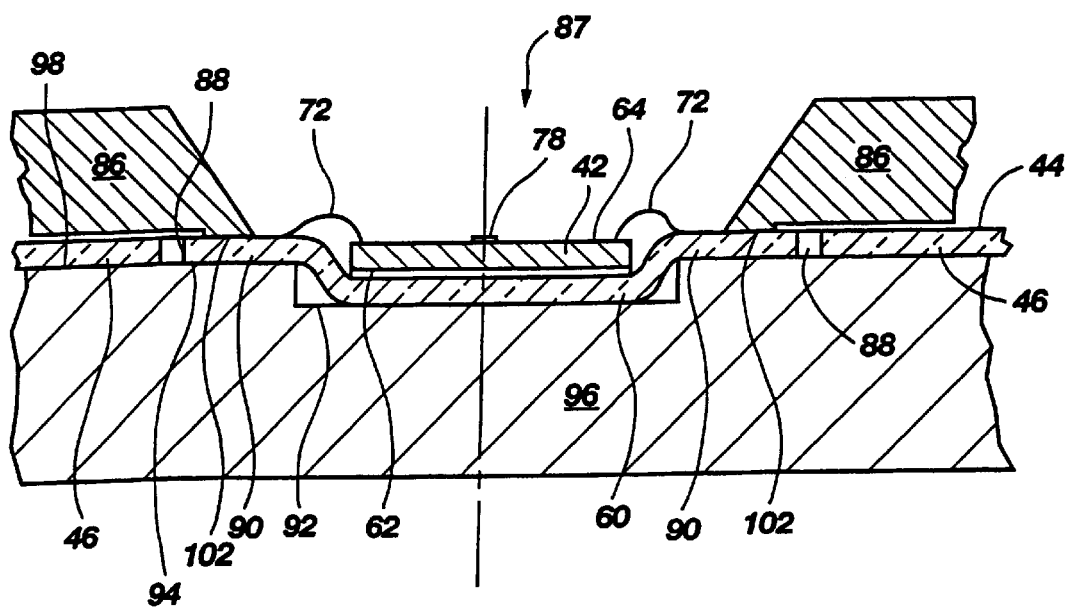
FIG. 4 is a cross-sectional side view of a portion of another embodiment of a leadframe strip of the invention and a semiconductor die bonded thereto, as taken along line 3—3 of FIG. 2.

An alternative configuration is shown in drawing FIG. 4, in which the die mount paddle 60 is depressed to a lower level 92 below an upper level 94 of the inner leads 46. The paddle support bars (see bar 78) and the clamping tabs 90 are bent upwardly from the semiconductor die 42 so that outer portions thereof underlie the clamping surface 102 of the upper clamp member 86 for firm clamping to the lower clamp member 96, e.g., heater block. While a packaged semiconductor device may be made with this alternate configuration, the coplanar configuration of drawing FIG. 3 is generally preferred for ease of manufacture.

Figure 5:
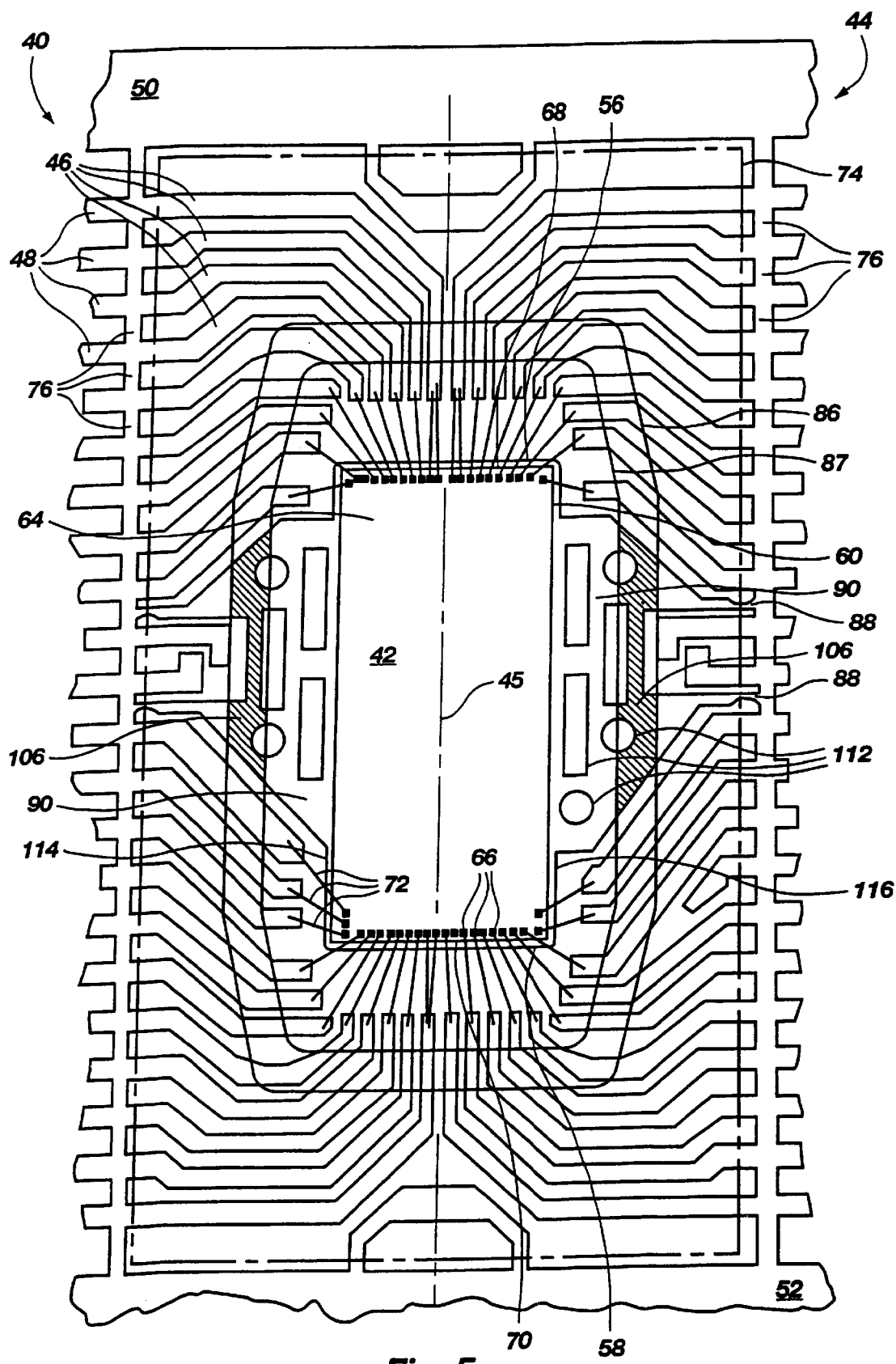
FIG. 5 is a plan view of a wire-bonded semiconductor device having another embodiment of a leadframe of the invention.

Drawing FIG. 5 depicts a variation, alternative embodiment, of the invention in which the clamping tabs 90 also act as paddle support bars.

As shown in drawing FIG. 5, a portion of an uncompleted exemplary semiconductor device 40 includes a semiconductor die 42 and a metal leadframe strip 44 to which the semiconductor die 42 is attached. The final package outline 74 is shown with centerline 45. The leadframe strip 44 includes inner leads 46, outer leads 48, and side rails 50 and 52. The inner leads 46 and outer leads 48 are supported from the side rails 50, 52 by dam bars 76.

The leadframe strip 44 also includes a die mount paddle 60 which is configured for the mounting of the semiconductor die 42 thereon, as previously described.

The semiconductor die 42 is illustrated as having an active surface 64 with a generally rectangular shape. Bond pads 66 are arrayed adjacent the semiconductor die ends (edges) 68, 70 for conductive attachment to the inner leads 46 with thin bond wires 72. The wire bonding process may be one of thermocompression, ultrasonics or thermosonics, for example.

In accordance with this embodiment of the invention, the die mount paddle 60 is formed with clamping tabs 90 on each of the sides 114, 116 having no (or few) bond pads 66. In contrast to the version shown in drawing FIGS. 2–4, the ends 56, 58 of the die mount paddle 60 are not connected to the side rails 50, 52 by support bars. Each clamping tab 90 is integral with the die mount paddle 60 over a major portion of the side 114 or 116. Each clamping tab 90 extends outwardly to underlie the upper clamp member 86 in tab clamping area 106 and may be clamped thereby to a lower clamp member, not shown, which underlies a major portion of the leadframe strip 44. The clamping tabs 90 are shown with constricted outer ends 88 connected to dam bars 76 for supporting the die mount paddle 60 during semiconductor die bond and wire bonding operations. Each clamping tab 90 is shown with apertures 112 therethrough whereby the flow of liquified polymer during device encapsulation is not deleteriously impeded. The clamping tabs 90 are configured to be totally encapsulated in the completed packaged semiconductor device 40.

The clamping tabs 90 may take any reasonable shape which will not result in shorting to leads or wires, and will not hinder polymer movement during encapsulation. Preferably, the clamping tabs 90 are positioned so that there is no need for bond wires 72 to pass over the tabs.

Following encapsulation, the tab outer ends 88 are severed, and the dam bars 76 removed to singulate the leads.

If desired, the die mount paddle 60 may be formed of a material different from the inner leads 46 and outer leads 48. In the current state of the art, however, additional cost would be incurred.

A major advantage of the inclusion of clamping tabs 90 in the die mount paddle 60 is the prevention of paddle movement during die bonding and the subsequent wire bonding operations. The reduced movement permits more secure bonding of the semiconductor die 42 to the die mount paddle 60. In addition, the first wire bond, i.e., to the bond pad 66, as well as the second wire bond, i.e., to an inner lead 46, are stronger. As a result, the device failure rate may be significantly reduced.

An additional advantage of the invention is the enhanced heat spread and dissipation through the clamping tabs.

It is apparent to those skilled in the art that various changes and modifications may be made to the leadframe configurations of the invention, devices formed therefrom and methods of making and practicing the invention as disclosed herein without departing from the spirit and scope of the invention as defined in the following claims.

What is claimed is:

1. A lead frame for attaching a semiconductor device thereto comprising:

at least a pair of rails;

a die mount paddle including at least one clamping tab extending from said die mount paddle, said at least one clamping tab used in clamping between a first clamping member and a second clamping member for wire bonding of a semiconductor die to said die mount paddle for reducing movement of said die mount paddle and a plurality of paddle support bars for connecting said die mount paddle to a portion of said lead frame;

at least two dam bars for connecting said at least a pair of rails; and a plurality of leads, each lead of the plurality of leads having an inner end located adjacent to said die mount paddle, and said each lead of the plurality of leads being joined to one of said at least two dam bars.

2. The lead frame of claim 1, wherein said plurality of paddle support bars comprise paddle support bars extending outwardly from opposing ends of said die mount paddle, said paddle support bars for connecting said die mount paddle to said at least a pair of rails for supporting said die mount paddle.

3. The lead frame of claim 1, wherein said at least one clamping tab is spaced from said inner ends of said plurality of leads and spaced from any other clamping tabs a distance for flow of encapsulation material for encapsulation of said semiconductor device.

4. The lead frame of claim 1, further comprising apertures in said at least one clamping tab.

5. The lead frame of claim 1, wherein said at least one clamping tab comprises an integral tab of said die mount paddle.

6. The lead frame of claim 1, wherein an outer end of said at least one clamping tab comprises a tab being discontinuous with said at least two dam bars, said at least a pair of rails, and said plurality of leads.

7. The lead frame of claim 1, wherein an outer end of said at least one clamping tab comprises a tab being discontinuous with said at least two dam bars, said at least a pair of rails, said plurality of leads, and any other clamping tabs.

8. The lead frame of claim 1, wherein an outer end of said at least one clamping tab is joined to one of said at least two dam bars and said at least a pair of rails for supporting and aligning said die mount paddle.

9. The lead frame of claim 1, wherein said plurality of leads, said die mount paddle and said at least one clamping tab are coplanar.

10. The lead frame of claim 1, wherein said die mount paddle is located at a position below a level of said inner ends of said plurality of leads and said at least one clamping tab is located upwardly at a position such that an inner portion of said at least one clamping tab is at a level of said die mount paddle while an outer end of said at least one clamping tab is at said level of said inner ends of said plurality of leads.

11. A lead frame for attaching a semiconductor die thereto comprising:
   at least a pair of rails;
   a die mount paddle for securing said semiconductor die thereto, said die mount paddle including at least one clamping tab extending from said die mount paddle, said at least one clamping tab for clamping between a first clamping member and a second clamping member for wire bonding of a semiconductor die to said die mount paddle for reducing movement of said die mount paddle and a plurality of paddle support bars for connecting said die mount paddle to a portion of said lead frame;
   dam bars connecting said at least a pair of rails;
   a plurality of inner leads, each inner lead of the plurality of inner leads having an inner end located adjacent to said die mount paddle and an outer end joined to one of said dam bars; and
   a plurality of outer leads, each outer lead of the plurality of outer leads having an inner end joined to one of said dam bars.

12. The lead frame of claim 11, wherein said plurality of paddle support bars comprise paddle support bars extending outwardly from opposing ends of said die mount paddle for connecting said die mount paddle to said at least a pair of rails for supporting said die mount paddle.

13. The lead frame of claim 11, wherein said at least one clamping tab is spaced from said plurality of inner leads and from any other clamping tabs a distance for flow of encapsulation material for encapsulation of said semiconductor device.

14. The lead frame of claim 11, further comprising apertures in said at least one clamping tab.

15. The lead frame of claim 11, wherein said at least one clamping tab includes an integral tab of said die mount paddle.

16. The lead frame of claim 11, wherein an outer end of said at least one clamping tab is discontinuous with said dam bars, said at least a pair of rails, said plurality of inner leads and said plurality of outer leads.

17. The lead frame of claim 11, wherein an outer end of said at least one clamping tab is discontinuous with said dam bars, said at least a pair of rails, said plurality of inner leads, said plurality of outer leads and any other clamping tabs.

18. The lead frame of claim 11, wherein an outer end of said at least one clamping tab is joined to one of said dam bars and said at least a pair of rails for supporting and aligning said die mount paddle.

19. The lead frame of claim 11, wherein said at least one clamping tab comprises a table for wire bonding of said semiconductor die to said plurality of inner leads of said leadframe for wires to extend between said semiconductor die and said plurality of inner leads without passage over said at least one clamping tab.

20. The lead frame of claim 11, wherein said plurality of inner leads, said die mount paddle and said at least one clamping tab are coplanar.

21. The lead frame of claim 11, wherein said die mount paddle is located at a position below a level of said plurality of inner leads and said at least one clamping tab is located at a position such that an inner portion of said at least one clamping tab is at the level of said die mount paddle while an outer end of said at least one clamping tab is positioned to be clamped at said level of said plurality of inner leads.

22. A lead frame for use in a semiconductor device assembly having a semiconductor die located therein comprising:
   at least a pair of rails;
   a die mount paddle for securing the semiconductor die thereto, said die mount paddle including at least one clamping tab extending from said die mount paddle, said at least one clamping tab for clamping between a first clamping member and a second clamping member for wire bonding of said semiconductor die to said die mount paddle for reducing movement of said die mount paddle and a plurality of paddle support bars for connecting said die mount paddle to a portion of said lead frame;
   dam bars connecting said at least a pair of rails;
   a plurality of inner leads having inner ends located adjacent to said die mount paddle, each inner lead of the plurality of inner leads having an outer end joined to one of said dam bars; and
   a plurality of outer leads, each outer lead of the plurality of outer leads having an inner end thereof joined to one of said dam bars.

23. The lead frame of claim 22, wherein said plurality of paddle support bars comprise opposing paddle support bars connecting said die mount paddle to said at least a pair of rails supporting said die mount paddle.

24. The lead frame of claim 22, wherein said die mount paddle is supported by paddle support bars extending from opposing ends of said die mount paddle to said at least a pair of rails.

25. The lead frame of claim 22, wherein said at least one clamping tab is spaced from said plurality of inner leads and from any other clamping tabs a distance for flow of encapsulation material for encapsulation of said semiconductor die.

26. The lead frame of claim 22, further comprising apertures in said at least one clamping tab.

27. The lead frame of claim 22, wherein said at least one clamping tab is integral with said die mount paddle.

28. The lead frame of claim 22, wherein an outer end of said at least one clamping tab is discontinuous with said dam bars, said at least a pair of rails, said plurality of inner leads and said plurality of outer leads.

29. The lead frame of claim 22, wherein an outer end of said at least one clamping tab is discontinuous with said dam bars, said at least a pair of rails, said plurality of inner leads, said plurality of outer leads and any other clamping tabs.

30. The lead frame of claim 22, wherein an outer end of said at least one clamping tab is joined to one of said dam bars and said at least a pair of rails for supporting and aligning said die mount paddle.

31. The lead frame of claim 22, wherein said at least one clamping tab comprises a tab for wire bonding of said semiconductor die to said plurality of inner leads to have wires extend between said semiconductor die and said plurality of inner leads without passage over said at least one clamping tab.

32. The lead frame of claim 22, wherein said plurality of inner leads, said die mount paddle and said at least one clamping tab are coplanar.

33. The lead frame of claim 22, wherein said die mount paddle is located at a position below a level of said plurality of inner leads and said at least one clamping tab is located at a position upwardly such that an inner portion of said at least one clamping tab is at the level of said die mount paddle while an outer end of said at least one clamping tab is positioned to be clamped at said level of said plurality of inner leads.

34. A lead frame used for connecting leads thereof to bond pads on an active surface of a semiconductor device comprising:

at least a pair of rails;

a die mount paddle for securing said semiconductor device thereto, said die mount paddle including at least one clamping tab extending from said die mount paddle, said at least one clamping tab used for clamping between a first clamping member and a second clamping member for wire bonding of said semiconductor device to said die mount paddle for reducing movement of said die mount paddle and a plurality of paddle support bars for connecting said die mount paddle to a portion of said lead frame;

dam bars connecting said at least a pair of rails;

a plurality of inner leads having inner ends located adjacent to said die mount paddle, each inner lead of said plurality of inner leads having an outer end joined to one of said dam bars; and a plurality of outer leads, each outer lead of said plurality of outer leads having an inner end joined to one of said dam bars.

35. The lead frame of claim 34, wherein said plurality of die paddle support bars comprise opposing paddle support bars connecting said die mount paddle to said at least a pair of rails for support of said die mount paddle.

36. The lead frame of claim 34, wherein said semiconductor device comprises an active surface having bond pads arrayed along opposing ends thereof, said die mount paddle supported by paddle support bars extending from opposing ends of said die mount paddle to said at least a pair of rails.

37. The lead frame of claim 34, wherein said at least one clamping tab comprises a tab spaced from said plurality of inner leads and from other clamping tabs for passage of a material therethrough for encapsulation of said semiconductor device.

38. The lead frame of claim 34, further comprising apertures in said at least one clamping tab for passage of a material therethrough for encapsulation of said semiconductor device.

39. The lead frame of claim 34, wherein said at least one clamping tab comprises a tab integral with said die mount paddle.

40. The lead frame of claim 34, wherein an outer end of said at least one clamping tab comprises a tab discontinuous with said dam bars, said at least a pair of rails, said plurality of inner leads and said plurality of outer leads.

41. The lead frame of claim 34, wherein an outer end of said at least one clamping tab comprises a tab discontinuous with said dam bars, said at least a pair of rails, said plurality of inner leads, said plurality of outer leads and any other clamping tabs.

42. The lead frame of claim 34, wherein an outer end of said at least one clamping tab comprises a tab joined to one of said dam bars and said at least a pair of rails for supporting and aligning said die mount paddle.

43. The lead frame of claim 34, wherein said at least one clamping tab comprises a table for wire bonding said bond pads of said semiconductor device to said plurality of inner leads having bond wires extending between said bond pads of said semiconductor device and said plurality of inner leads without passage over said at least one clamping tab.

44. The lead frame of claim 34, wherein said plurality of inner leads, said die mount paddle and said at least one clamping tab are coplanar.

45. The lead frame of claim 34, wherein said die mount paddle is located at a position below a level of said plurality of inner leads and said at least one clamping tab is located at a position such that an inner portion of said at least one clamping tab is at the level of said die mount paddle while an outer end of said at least one clamping tab is positioned to be clamped at said level of said plurality of inner leads.

46. A lead frame used for an encapsulated semiconductor device assembly having a semiconductor die therein, comprising:

at least a pair of rails;

a die mount paddle for bonding of said semiconductor die thereto, said die mount paddle including at least one clamping tab extending from said die mount paddle, said at least one clamping tab for clamping between a first clamping member and a second clamping member for wire bonding said semiconductor die to said die mount paddle for reducing movement of said die mount paddle and a plurality of paddle support bars for connecting said die mount paddle to a portion of said lead frame;

dam bars for connecting said at least a pair of rails;

a plurality of inner leads having inner ends located adjacent to said die mount paddle, each inner lead of the plurality of inner leads having an outer end thereof joined to one of said dam bars; and a plurality of outer leads, each outer lead of the plurality of outer leads having an inner end thereof joined to one of said dam bars.

47. The lead frame of claim 46, wherein said plurality of die support bars comprise opposing paddle support bars connecting said die mount paddle to said at least a pair of rails for supporting said die mount paddle.

48. The lead frame of claim 46, wherein said semiconductor die comprises an active surface with bond pads arrayed along two opposing ends thereof, said die mount paddle supported by paddle support bars extending from opposing ends of said die mount paddle to said at least a pair of rails.

49. The lead frame of claim 46, wherein said at least one clamping tab comprises a tab spaced from said plurality of inner leads and from other clamping tabs for allowing passage of a material therethrough for encapsulation of said semiconductor die.

50. The lead frame of claim 46, further comprising apertures in said at least one clamping tab for allowing passage of a material therethrough for encapsulation of said semiconductor die.

51. The lead frame of claim 46, wherein said at least one clamping tab comprises a tab integral with said die mount paddle.

52. The lead frame of claim 46, wherein an outer end of said at least one clamping tab comprises a tab discontinuous with said dam bars, said at least a pair of rails, said plurality of inner leads and said plurality of outer leads.

53. The lead frame of claim 46, wherein an outer end of said at least one clamping tab comprises a tab discontinuous with said dam bars, said at least a pair of rails, said plurality of inner leads, said plurality of outer leads and any other clamping tabs.

54. The lead frame of claim 46, wherein an outer end of said at least one clamping tab comprises a tab joined to one of said dam bars and said at least a pair of rails for supporting and aligning said die mount paddle for bonding of said semiconductor die thereto and for wire bonding said semiconductor die to said plurality of inner leads.

55. The lead frame of claim 46, wherein said at least one clamping tab comprises a tab for wire bonding having bond wires extending between said semiconductor die and said plurality of inner leads without passage over said at least one clamping tab.

56. The lead frame of claim 46, wherein said plurality of inner leads, said die mount paddle and said at least one clamping tab are coplanar.

57. The lead frame of claim 46, wherein said die mount paddle is located at a position below a level of said plurality of inner leads and said at least one clamping tab is located at a position such that an inner portion of said at least one clamping tab is at the level of said die mount paddle while an outer end of said at least one clamping tab is positioned to be clamped at said level of said plurality of inner leads.

58. A packaged semiconductor device assembly comprising:
- a conductive leadframe having at least a pair of rails, a die mount paddle, at least a pair of dam bars each having a portion connected to said conductive lead frame, a plurality of inner leads having inner ends located adjacent to said die mount paddle, a plurality of outer leads, and at least one clamping tab integral with said die mount paddle, said at least one clamping tab for clamping between a first clamping member and a second clamping member for wire bonding of a semiconductor die to said die mount paddle for reducing movement of said die mount paddle;
- a semiconductor die having a back side bonded to said die mount paddle and an active surface having a plurality of bond pads thereon;
- a plurality of conductive wires connecting said plurality of bond pads to said plurality of inner leads; and
- material for encapsulating and sealing said plurality of inner leads, said die mount paddle, said plurality of conductive wires and said at least one clamping tab.

59. The packaged semiconductor device assembly of claim 58, further comprising opposing paddle support bars connected from said die mount paddle to said at least a pair of rails for supporting said die mount paddle.

60. The packaged semiconductor device assembly of claim 58, wherein said plurality of bond pads of said semiconductor die are arrayed along opposing ends thereof, said die mount paddle supported by paddle support bars extending from opposing ends of said die mount paddle to said at least a pair of rails.

61. The packaged semiconductor device assembly of claim 58, wherein said at least one clamping tab comprises a tab spaced from said plurality of inner leads and from other clamping tabs for passage of liquified polymer therethrough.

62. The packaged semiconductor device assembly of claim 58, further comprising apertures in said at least one clamping tab allowing passage of said material therethrough.

63. The packaged semiconductor device assembly of claim 58, wherein said at least one clamping tab comprises a tab integral with said die mount paddle.

64. The packaged semiconductor device assembly of claim 58, wherein an outer end of said at least one clamping tab is discontinuous with said at least a pair of dam bars, said at least a pair of rails, said plurality of inner leads and said plurality of outer leads.

65. The packaged semiconductor device assembly of claim 58, wherein an outer end of said at least one clamping tab comprises a tab discontinuous with said at least a pair of dam bars, said at least a pair of rails, said plurality of inner leads, said plurality of outer leads and any other clamping tabs.

66. The packaged semiconductor device assembly of claim 58, wherein an outer end of said at least one clamping tab comprises a tab joined to one of said at least a pair of dam bars and said at least a pair of rails for supporting and aligning said die mount paddle.

67. The packaged semiconductor device assembly of claim 58, wherein said at least one clamping tab comprises a tab for wire bonding having bond wires extending between said plurality of bond pads of said semiconductor die and said plurality of inner leads without passage over said at least one clamping tab.

68. The packaged semiconductor device assembly of claim 58, wherein said plurality of inner leads, said die mount paddle and said at least one clamping tab are coplanar.

69. The packaged semiconductor device assembly of claim 58, wherein said die mount paddle is located at a position below a level of said plurality of inner leads and said at least one clamping tab is located at a position such that an inner portion of said at least one clamping tab is at a level of said die mount paddle while an outer end of said at least one clamping tab is positioned to be clamped at said level of said plurality of inner leads.

* * * * *

UNITED STATES PATENT AND TRADEMARK OFFICE
CERTIFICATE OF CORRECTION

PATENT NO. : 6,507,094 B2  
DATED : January 14, 2003  
INVENTOR(S) : David J. Corisis It is certified that error appears in the above-identified patent and that said Letters Patent is hereby corrected as shown below:

Column 4,
Line 25, delete the period after "bar"
Line 46, delete the comma after "108"

Column 5,
Line 43, delete the comma after "the"

Column 11,
Line 15, change "lead frame" to -- leadframe --

Signed and Sealed this

Twenty-third Day of December, 2003

JAMES E. ROGAN
*Director of the United States Patent and Trademark Office*